(12) United States Patent
Tamura et al.

(10) Patent No.: US 9,431,285 B2
(45) Date of Patent: Aug. 30, 2016

(54) METHOD OF MANUFACTURING SEMICONDUCTOR DEVICE

(71) Applicant: FUJITSU SEMICONDUCTOR LIMITED, Yokohama, Kanagawa (JP)

(72) Inventors: Naoyoshi Tamura, Yokohama (JP); Keita Nishigaya, Kuwana (JP); Mitsuaki Hori, Kuwana (JP); Hiroe Kawamura, Inabe (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 61 days.

(21) Appl. No.: 13/690,418

(22) Filed: Nov. 30, 2012

(65) Prior Publication Data
US 2013/0196482 A1   Aug. 1, 2013

(30) Foreign Application Priority Data
Jan. 30, 2012   (JP) .................. 2012-016282

(51) Int. Cl.
*H01L 21/3065* (2006.01)
*H01L 21/76* (2006.01)
(Continued)

(52) U.S. Cl.
CPC ......... *H01L 21/76* (2013.01); *H01L 21/02046* (2013.01); *H01L 21/302* (2013.01); *H01L 21/3247* (2013.01); *H01L 21/76224* (2013.01);
(Continued)

(58) Field of Classification Search
CPC ........... H01L 21/0223; H01L 21/0231; H01L 21/02301; H01L 21/02661; H01L 21/02345; H01L 21/02348; H01L 21/428; H01L 21/3065; H01L 21/32136; H01L 21/67069; H01L 21/776; H01L 21/76814; H01L 21/6814; H01L 21/8232; H01L 21/02; H01L 21/02263; H01L 21/34; H01L 21/335; H01L 21/322; H01L 21/311; H01L 21/465
USPC .................................................. 438/400, 723
See application file for complete search history.

(56) References Cited

U.S. PATENT DOCUMENTS 5,326,406 A * 7/1994 Kaneko et al. ............... 134/1
5,571,339 A * 11/1996 Ringel et al. ................ 136/252
(Continued)

FOREIGN PATENT DOCUMENTS

JP   2000-269221 A   9/2000
JP   2002-128593 A   5/2002
(Continued)

OTHER PUBLICATIONS

Nishizawa et al., Origin of type-C defects on the Si(100)-(2x1) surface, 2002, Phys. Rev. B, vol. 65, pp. 161302.*
(Continued)

*Primary Examiner* — Julia Slutsker
*Assistant Examiner* — Natalia Gondarenko
(74) *Attorney, Agent, or Firm* — Westerman, Hattori, Daniels & Adrian, LLP

(57) ABSTRACT

A method of manufacturing a semiconductor device including performing a first thermal processing a silicon substrate in a first atmosphere and at a first temperature to remove an oxide film above a surface of the silicon substrate, and after the first thermal processing, performing a second thermal processing the silicon substrate in a second atmosphere containing hydrogen and at a second temperature lower than the first temperature to terminate the surface of the silicon substrate with hydrogen.

16 Claims, 22 Drawing Sheets

(51) Int. Cl.

| | | |
|---|---|---|
| *H01L 21/302* | (2006.01) | |
| *H01L 21/02* | (2006.01) | |
| *H01L 21/324* | (2006.01) | |
| *H01L 21/762* | (2006.01) | |
| *H01L 21/311* | (2006.01) | |
| *H01L 21/28* | (2006.01) | |
| *H01L 29/66* | (2006.01) | |

(52) U.S. Cl.
CPC ........ *H01L 21/28238* (2013.01); *H01L 29/665* (2013.01); *H01L 29/6659* (2013.01)

(56) References Cited

U.S. PATENT DOCUMENTS

| | | | |
|---|---|---|---|
| 2003/0157774 A1* | 8/2003 | Tominari et al. ............. | 438/312 |
| 2003/0203646 A1* | 10/2003 | Tanabe et al. ................ | 438/773 |
| 2004/0175955 A1* | 9/2004 | Haselden et al. ............ | 438/757 |
| 2005/0250297 A1* | 11/2005 | Shive et al. .................. | 438/471 |
| 2009/0184358 A1* | 7/2009 | Lenoble et al. .............. | 257/315 |
| 2009/0267119 A1* | 10/2009 | Tamura ......................... | 257/288 |
| 2011/0312121 A1* | 12/2011 | Yamazaki ....................... | 438/71 |
| 2013/0093060 A1 | 4/2013 | Oka et al. | |
| 2013/0183834 A1* | 7/2013 | Rogers et al. ................ | 438/788 |

FOREIGN PATENT DOCUMENTS

| | | |
|---|---|---|
| JP | 2007-536738 A | 12/2007 |
| JP | 2010-272798 A | 12/2010 |
| WO | 2005/114716 A2 | 12/2005 |
| WO | 2012/008087 A1 | 1/2012 |

OTHER PUBLICATIONS

Kant et al., Experimental Investigation of Silicon Surface Migration in Low Pressure Nonreducing Gas Environments, 2009, Electrochemical and Solid-State Letters, 12, 12, pp. H437-H440.*

Tables of Physical & Chemical Constants, 3.4.4. Chemistry, Kaye & Laby Online, Version 1.0, 2005, http://www.kayelaby.npl.co.uk/toc/, downloaded on Aug. 5, 2015.*

Nuth III et al., Silicates Do Nucleate in Oxygen-rich CircumstellarOutflows: NewVapor Pressure Data for SiO, 2006, The Astrophysical Journal, 649, pp. 1178-1183.*

Japanese Office Action dated Nov. 10, 2015 issued in Japanese Patent Application No. 2012-016282, with English translation, (9 pages).

Office Action dated Jun. 28, 2016, issued in counterpart Japanese application No. 2012-016282, with English translation (6 pages).

* cited by examiner

METHOD OF MANUFACTURING SEMICONDUCTOR DEVICE

CROSS-REFERENCE TO RELATED APPLICATION

This application is based upon and claims the benefit of priority of the prior Japanese Patent Application No. 2012-016282, filed on Jan. 30, 2012, the entire contents of which are incorporated herein by reference.

FIELD

The embodiments discussed herein are related to a method of manufacturing a semiconductor device.

BACKGROUND

The planarity of a surface of a silicon substrate much effects the characteristics of a device to be formed on, and techniques for making the silicon substrate surface more planar are proposed.

As a technique for flattening the surface of the silicon substrate, for example, the flattening thermal processing which makes thermal processing in a vacuum or a hydrogen atmosphere is known. In this method, the thermal processing is made in a vacuum or a hydrogen atmosphere at about 900 C-1200 C to migrate and rearrange the silicon atoms of the silicon substrate surface for the flatten.

The followings are examples of related: Japanese Laid-open Patent Publication No. 05-243266; Japanese Laid-open Patent Publication No. 07-165410; Japanese Laid-open Patent Publication No. 11-176828; Japanese Laid-open Patent Publication No. 2005-142445; Japanese Laid-open Patent Publication No. 2005-150398; and Japanese Patent No. 2689985.

However, the inventors of the present application have made earnest studies of the relationships between the flatness of the silicon substrate and the device characteristics and have made it clear for the first time that the conventional flattening thermal processing cannot make the atomic level flatness sufficient, and this causes increase of the low-frequency noise.

SUMMARY

According to one aspect of an embodiment, there is provided a method of manufacturing a semiconductor device including performing a first thermal processing a silicon substrate in a first atmosphere and at a first temperature to remove an oxide film above a surface of the silicon substrate, and after the first thermal processing, performing a second thermal processing the silicon substrate in a second atmosphere containing hydrogen and at a second temperature lower than the first temperature to terminate the surface of the silicon substrate with hydrogen.

The object and advantages of the embodiment will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENTS

A First Embodiment

A method of manufacturing a semiconductor device according to a first embodiment will be described with reference to FIGS. 1A to 9.

Figure 1A:
FIGS. 1A-1B are cross-sectional views illustrating a method of manufacturing a semiconductor device according to a first embodiment.
Figure 1B:
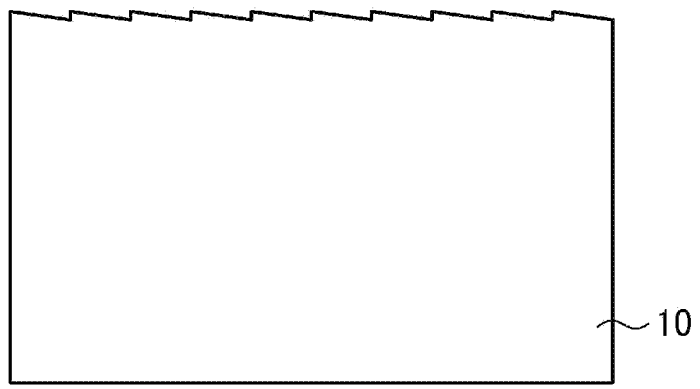
Figure 2:
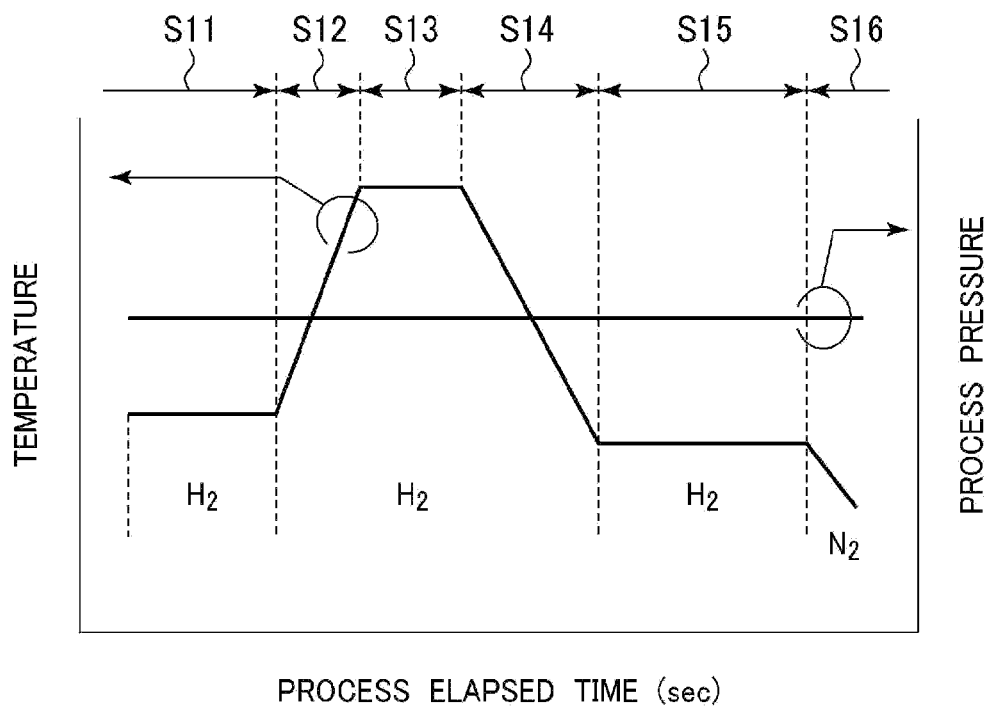
FIGS. 2 and 3 are graphs illustrating a thermal processing profile of the method of manufacturing the semiconductor device according to the first embodiment.
Figure 3:
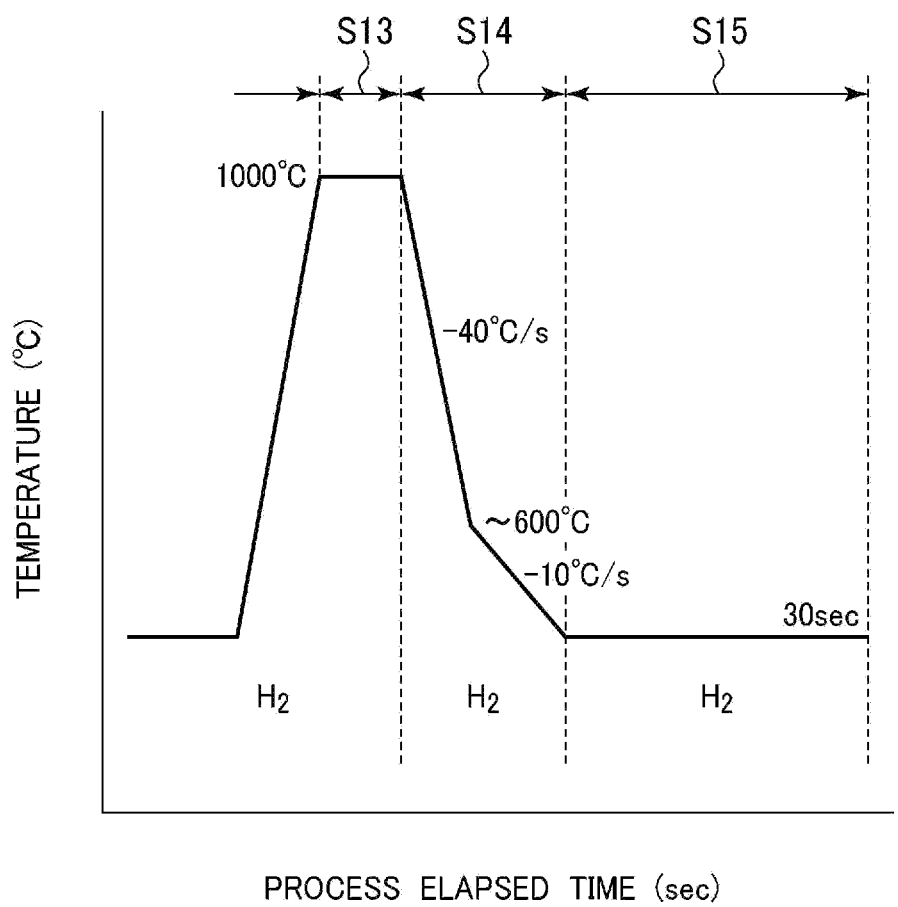
Figure 4:
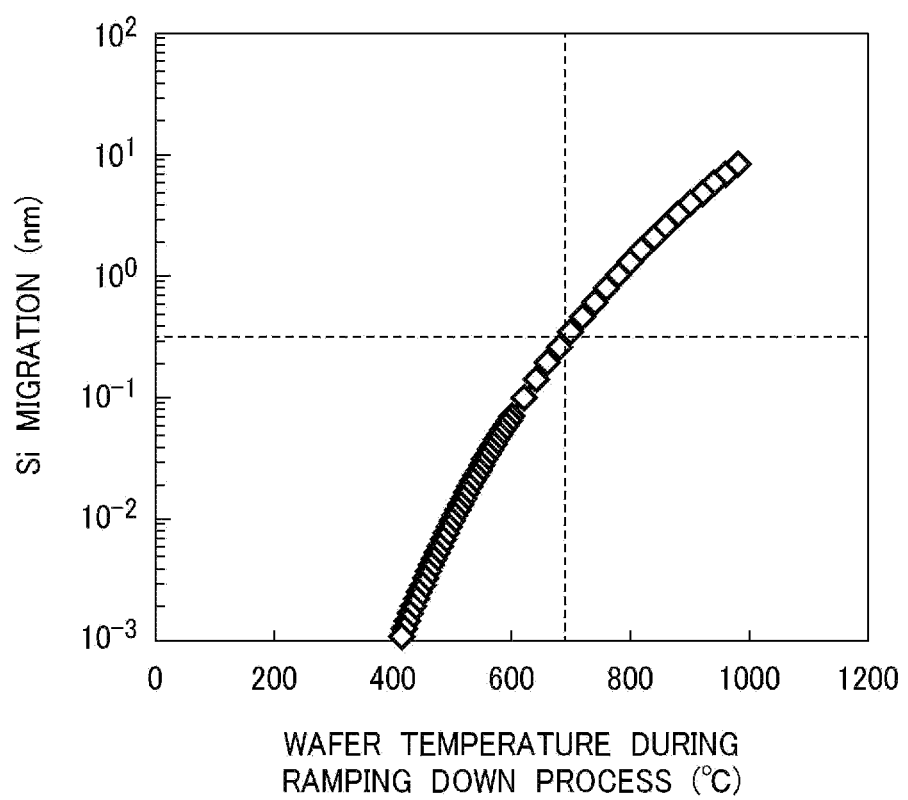
FIG. 4 is a graph illustrating a relationship between a temperature of a silicon substrate and a migration distance of silicon atoms.
Figure 5:
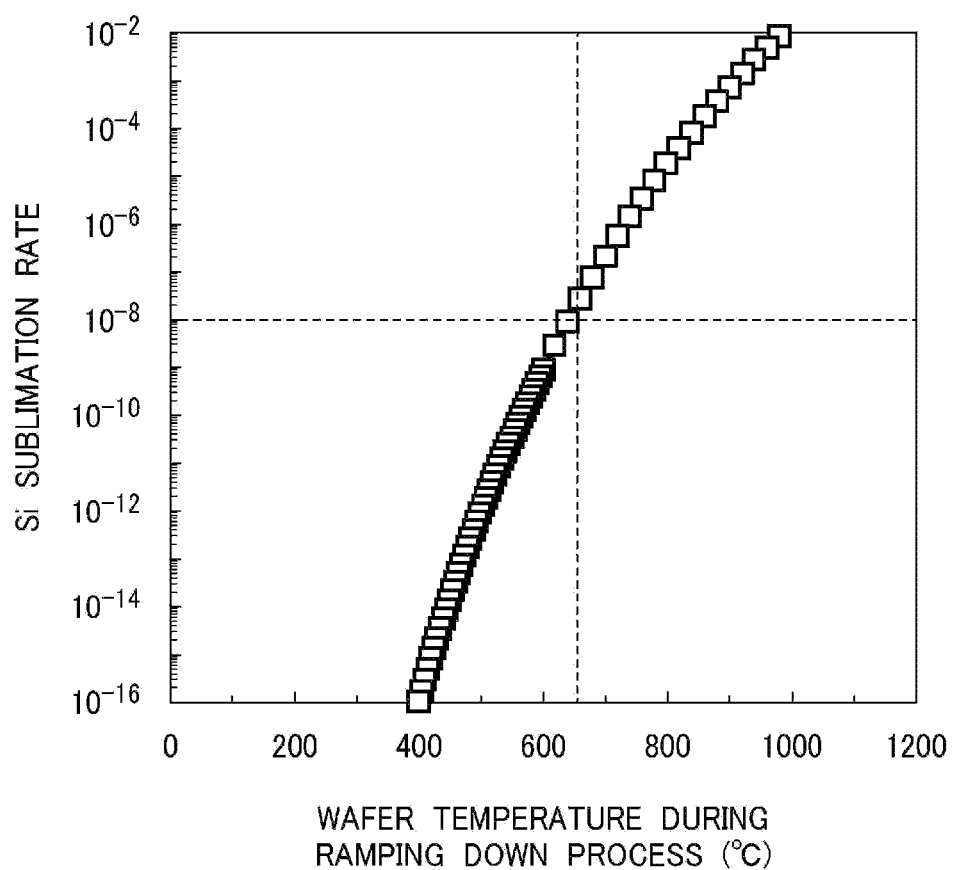
FIG. 5 is a graph illustrating a relationship between a temperature of a silicon substrate and a sublimation rate of silicon atoms.
Figure 6:
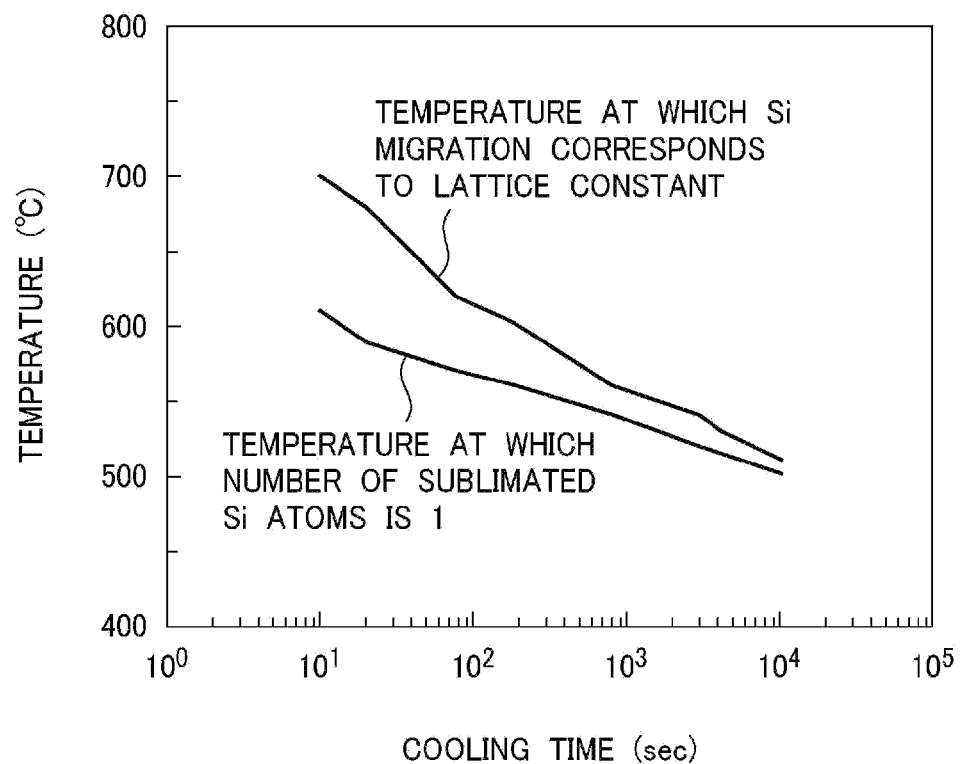
FIG. 6 is a graph illustrating relationships between a temperature at which a migration rate of silicon atoms correspond to a lattice constant and a temperature at which the number of silicon atoms to be sublimated becomes 1, and a ramp-down period of time of cooling from 1000 C to 600 C.
Figure 7:
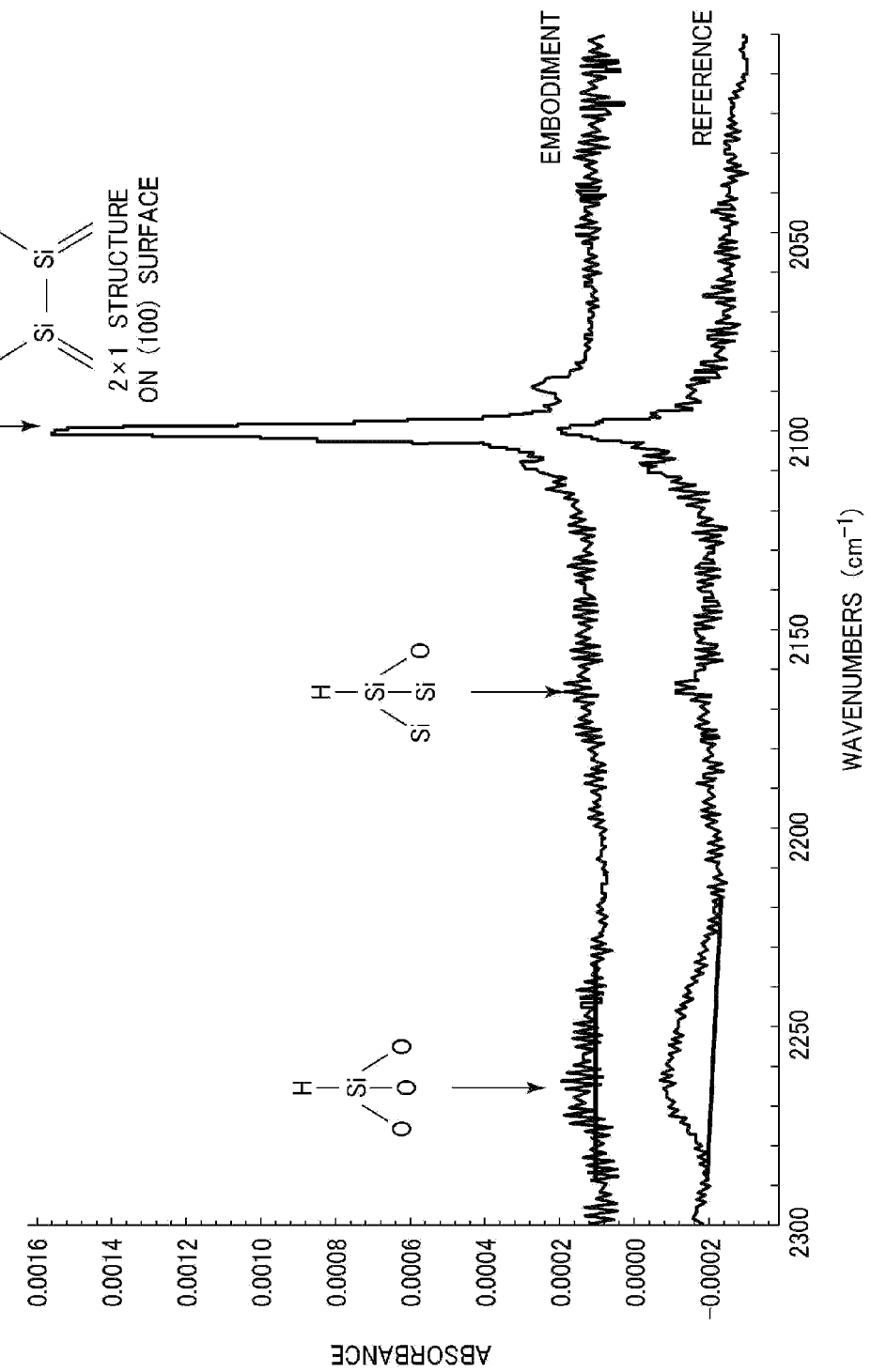
FIG. 7 is a graph illustrating a result of FT-IR ATR analysis of a surface of a silicon substrate after thermal processing.
Figure 8:
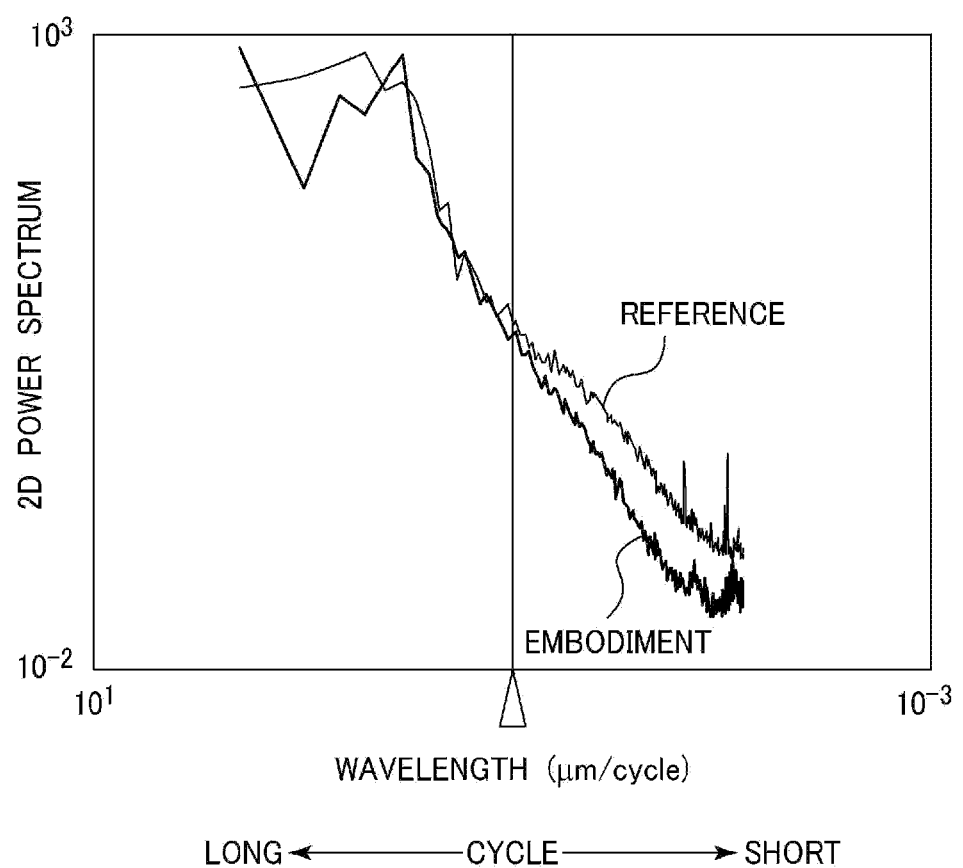
FIG. 8 is a graph illustrating a two-dimensional power spectrum of a surface roughness of a silicon substrate after thermal processing.
Figure 9:
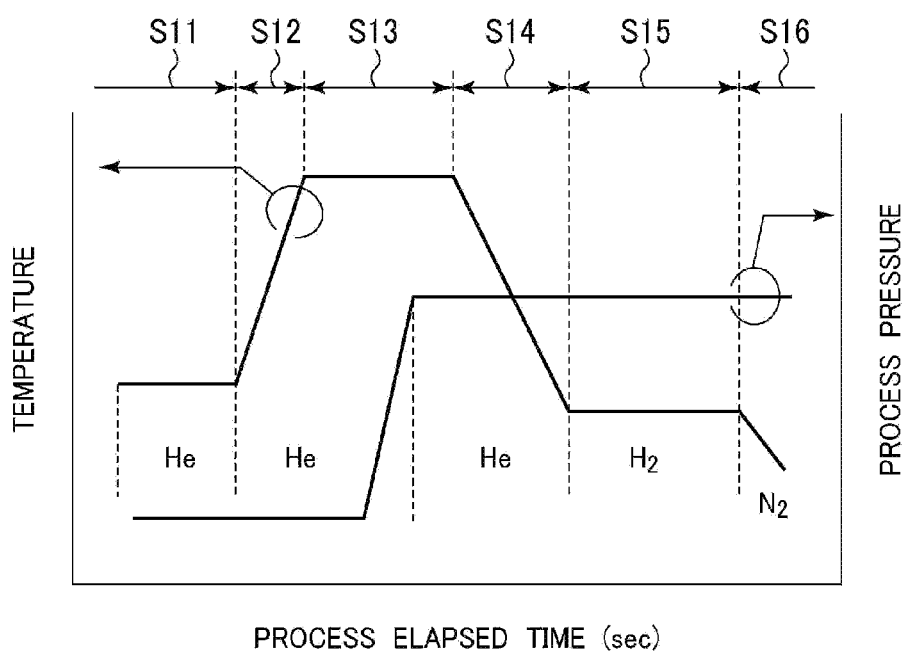
FIG. 9 is a graph illustrating a thermal processing profile of a method of manufacturing a semiconductor device according to a modification of the first embodiment.

FIGS. 1A-1B are cross-sectional views illustrating the method of manufacturing the semiconductor device according to the present first embodiment. FIGS. 2 and 3 are graphs illustrating a thermal processing profile of the method of manufacturing the semiconductor device according to the present embodiment. FIG. 4 is a graph illustrating a relationship between a temperature of a silicon substrate and a migration distance of silicon atoms. FIG. 5 is a graph illustrating a relationship between a temperature of a silicon substrate and a sublimation rate of silicon atoms. FIG. 6 is a graph illustrating relationships between a temperature at which a migration rate of silicon atoms correspond to a lattice constant and a temperature at which the number of silicon atoms to be sublimated becomes 1, and a ramp-down period of time of cooling from 1000 C to 600 C. FIG. 7 is a graph illustrating a result of FT-IR ATR analysis of a surface of a silicon substrate after thermal processing. FIG. 8 is a graph illustrating a two-dimensional power spectrum of a surface roughness of a silicon substrate after thermal processing. FIG. 9 is a graph illustrating a thermal processing profile of a method of manufacturing a semiconductor device according to a modification of the present embodiment.

First, a silicon substrate 10 having (100) surface as the primary surface is subjected to chemical processing to remove a silicon oxide film (not illustrated) formed on the surface of the silicon substrate 10. This chemical processing corresponds to a cleaning processing which is made at the initial stage of a semiconductor device manufacturing process for the purpose of removing metal contaminants, etc. on the silicon substrate 10, the pretreatment for removing existing silicon oxide film when a prescribed silicon oxide film (e.g., gate insulating film) is formed on the silicon substrate 10, and others.

After the chemical processing, a silicon oxide film, such as a chemical oxide film formed during the chemical processing, a native oxide film formed by leaving the silicon substrate 10 in the atmosphere after the chemical processing, etc. is formed on the surface of the silicon substrate 10. In the specification of the present application, to discriminate such silicon oxide film 12 from silicon oxide film to be used as a constituent part of the semiconductor device (e.g., gate insulating film), the silicon oxide film 12 including the chemical oxide film is often called "the native oxide film".

In the interface between such formed silicon oxide film 12 and the silicon substrate 10, roughness illustrated by the concavities and convexities as exemplified in FIG. 1A exists. The roughness of the surface of the silicon substrate 10 has been already present before the silicon substrate 10 is purchased and remains in the interface between the silicon substrate 10 and the silicon oxide film 12 after the silicon oxide film 12 is formed. In FIG. 1A, the concavities and convexities of the interface are illustrated periodically but actually are not periodic. The difference in level of the concavities and convexities is not constant. The thickness of the silicon oxide film 12 formed on the silicon substrate having rough surface is not always uniform.

Next, the silicon substrate 10 with the silicon oxide film 12 formed on is loaded in a thermal processing furnace and is subjected to thermal processing of the profile as illustrated in FIG. 2. The thermal processing furnace can make thermal processing on the silicon substrate 10 in a gas atmosphere of a prescribed pressure. For increasing the productivity, etc., the thermal processing furnace which can make rapid thermal processing is preferable, and a lamp annealing system, for example, is applicable.

The thermal processing profile illustrated in FIG. 2 is divided in 6 steps of Step S11-Step S16.

Step S11 is for pre-heating the silicon substrate 10 to improve the intra-plane temperature uniformity of the silicon substrate 10. The processing temperature of Step S11 is not specifically limited as long as the processing temperature of Step S11 is lower than the processing temperature of Step S13, and is, e.g., 550 C. The processing period of time of Step S11 is not specifically limited as long as the processing period of time is sufficient to stabilize the temperature of the silicon substrate 10, and is, e.g., 30 seconds.

Step S12 is for ramping up the processing temperature of Step S11 to the processing temperature of Step S13. The ramp rate of ramping up from the processing temperature of Step S11 to the processing temperature of Step S13 is not specifically limited, and can be, e.g., 80 C/second.

Step S13 is for removing the silicon oxide film 12 and enhancing the rearrangement of the silicon atoms of the surface of the silicon substrate 10 to flatten the surface. The processing temperature of the Step S13 is preferably 950 C-1200 C, and is, e.g., 1000 C.

The thermal processing is made in a reduction atmosphere, e.g., a hydrogen atmosphere and at about 950 C-1200 C to thereby dissociate the Si—O bonds of the surface of the silicon substrate 10 to eliminate the oxygen atoms and the silicon atoms and resultantly remove the silicon oxide film 12. Then, the silicon atoms of the surface are migrated and rearranged to be energetically more stable, the surface of the silicon substrate 10 has 2×1 structure of Si(100), and a step-and-terrace structure is formed on the surface of the silicon substrate 10. The step-and-terrace structure is the surface structure of a plane (terrace) and a step of a height of 1 atomic layer continuously formed, and has a smooth surface on the atomic layer level. Thus, the surface of the silicon substrate 10 is flattened at the atomic layer level (see FIG. 1B).

Step S14 is for ramping down from the processing temperature of Step S13 to the processing temperature of Step S15. The ramp rate of ramping down from the processing temperature of Step S13 to the processing temperature of Step S15 is not specifically limited as long as the ramp rate is not less than about −2 C/minute, and is, e.g., −75 C/second. The ramp rate may not be essentially constant, and in the ramping down process, the ramping down rate may be changed. The reason for setting the ramping down rate at not less than about −2/second will be described below.

Step S15 is for rearranging the silicon atoms of the surface of the silicon substrate 10 to thereby flatten the surface and terminating the dangling bonds of the silicon atoms of the surface of the silicon substrate 10 with hydrogen atoms.

The surface of the silicon substrate 10 is flattened by the rearrangement of the surface silicon atoms in Step S13, but the migration of the silicon atoms includes not only the two-dimensional migration in the surface of the silicon substrate 10 but also three-dimensional migration, i.e., elimination of the silicon atoms from the silicon substrate 10. When the silicon atoms are eliminated from the silicon substrate 10, defects (C-type defects) are formed at the parts from which the silicon atoms have been eliminated, and the defects are a cause for impairing the flattening of the surface of the silicon substrate 10.

Then, in Step S15, the thermal processing is made at a temperature at which two-dimensional migration of the silicon atoms is more dominant than the three-dimensional migration of the silicon atoms to thereby repair the defects caused by the elimination by the two-dimensional migration of the silicon atoms and improve the planarity of the surface of the silicon substrate 10. The thermal processing temperature at this time is set lower than a temperature corresponding to the dissociation energy of the Si—H bonds, whereby the dangling bonds of the surface silicon atoms can be surely terminated with hydrogen atoms, and the chemical stability of the surface of the silicon substrate 10 can be improved.

In view of this, the thermal processing temperature of Step S15 is preferably about 350 C-500 C, e.g., 400 C. The processing period of time is a period of time sufficient for the silicon atoms to migrate and fill the defects. For example, at the processing temperature of 400 C, the processing period of time is preferably at least 30 seconds or more.

Step S16 is for ramp-down from the processing temperature of Step S15 to the room temperature so as to unload the processed silicon substrate 10 out of the thermal processing furnace.

Steps S11-S15 are made in a hydrogen atmosphere, and Step S16 is made in an inert gas atmosphere, e.g., a nitrogen atmosphere. The pressure inside the furnace is suitably selected in the range which permits the above-described purposes of the respective steps to be achieved. For example, the gas flow rate is 1 liter/min, and the pressure inside the furnace is constantly 20 Torr throughout Steps S11-S16.

Next, the significance of performing Step S15 between Step S14 and Step S16 will be detailed.

To describe the effects of performing Step S15, the thermal processing profile as illustrated in FIG. 3 is assumed. This thermal processing profile is for performing Step S13 at 1000 C, next, ramping down the processing temperature to 600 C at a −40 C/second ramping down rate, subsequently, ramping down the processing temperature to 400 C at a −10 C ramping down rate in Step S14, and performing Step S15 at 400 C for 30 seconds.

When a monomer silicon is assumed the two-dimensional migration rate of the silicon atoms of the surface of the silicon substrate can be expressed as follows. L is an effective migration distance of the silicon atoms. q is an elementary electric charge. Di is a diffusion coefficient in case of temperature $T_i$. $k_B$ is a Boltzmann constant. Ea is an activation energy.

$$L = \Sigma 2\sqrt{(D_i \times \Delta t)}$$

$$D_i = D_o \times \exp(-q \cdot E_a/k_B T_i)$$

$$D_o = 1 \times 10^{-3} \text{ [cm}^2\text{/s]}$$

$$E_a = 2.0 \text{ [eV]}$$

FIG. 4 is the calculation result of the relationship between the temperature of the silicon substrate and the migration distance of the silicon atoms in Step S14 given based on the above-formula. Based on the result of FIG. 4, the total migration distance of the silicon atoms in step S14 was estimated at 35.9 nm. The migration distance at 700 C was estimated at about 0.543 nm, which corresponds to the lattice constant of silicon. The migration distance of the silicon atoms in Step S15 alone was estimated at 0.536 nm.

In consideration of the repair of the C-type defects by the migration of the silicon atoms, it will be preferable that the silicon atoms migrate by about the lattice constant of silicon. Based on the result described above, the migration distance of the silicon atoms in Step S15 alone is about the lattice constant of silicon, and it is understood that the thermal processing of Step S15 causes the atom migration sufficient to repair the C-type defects.

On the other hand, the three-dimensional migration of the silicon atoms, i.e., the sublimation rate $R_i$ of the silicon atoms resulting from the dissociation of the Si—Si bonds by the hydrogen atoms can be expressed as follows.

$$R_i = R_o \times \exp(-q \cdot E_a/k_B T_i)$$

$$E_a = 4.0 \text{ [eV]}$$

FIG. 5 illustrates the calculation result of the relationship between the temperature of the silicon substrate and the sublimation rate of the silicon atoms in Step 14, based on the above formula. Based on the result of FIG. 5, it is seen that when the silicon atoms are $1 \times 10^6$ atoms (a 1000 atoms×1000 atoms region is assumed), the C-type defect due to the sublimation of the silicon atoms are made up to about 650 C.

The migration distance of the silicon atoms up to about 700 C is about the lattice constant of silicon as described above, but the migration distance of the silicon atoms at a temperature less than 700 C is smaller than the lattice constant of silicon. That is, from 700 C to 650 C, the generation of the C-type defects is more dominant than the repair of the C-type defects. Accordingly, when the processing temperature is ramped down to the room temperature without performing Step S15, the repair of the C-type defects is insufficient, and the C-type defects remain, which lowers the planarity of the surface of the silicon substrate.

Thus, Step S15 is performed, whereby even when the C-type defects generate in Step S14, these C-type defects can be repaired, and the planarity of the surface of the silicon substrate can be improved.

Next, the effect of the ramping down rate in Step S14 will be described.

FIG. 6 is a graph illustrating the relationship between the temperature at which the migration distance of the silicon atoms corresponds to the lattice constant and the temperature at which the number of the silicon atoms to be sublimated is 1, and the ramping down period of time of ramping down from 1000 C to 600 C.

As illustrated in FIG. 6, even when the ramping down period of time from 1000 C to 600 C is 10000 seconds (2.7 hours, −2.4 C/min in terms of the ramping down rate), the temperature at which the number of the silicon atoms to be sublimated is 1 never surpass the temperature at which the migration distance of the silicon atoms corresponds to the lattice constant. That is, up to the ramping down period of time of about 10000 seconds, the C-type defects are never perfectly repaired in Step S14.

When the ramping down period of time exceeds 20000 seconds, at last the temperature at which the migration distance of the silicon atoms corresponds to the lattice constant exceed the temperature at which the number of the silicon atoms to be sublimated is 1. The temperature at this time is about 500 C, and ramping down rate is −1.2 C/minute. That is, when the ramping down rate in Step S14 is not less than about −2.0 C/minute, the repair of the C-type defects by the migration of the silicon atoms is more dominant than the generation of the C-type defect.

Considering the productivity of the semiconductor device, it is preferable that the ramping down rate in Step S14 is set at a rate higher than −2.0 C/minute. In this case, the repair of the C-type defects by the migration of the silicon atoms will be insufficient, and it is seen that the repair of the C-type defects by Step S15 is very important.

FIG. 7 is a graph illustrating the result of the FT-IR ATR analysis of the surface of the silicon substrate after the thermal processing. In the graph, the result of the case that the thermal processing of the present embodiment was used is shown upper (EMBODIMENT), and the result of the case that Step S14 is followed directly by Step S16 without Step S15 is shown lower (REFERENCE).

As illustrated in FIG. 7, in the case that the thermal processing of the present embodiment was used, the peak intensity of the monohydride bond expressing the Si(001) 2×1 structure to be the index of the improvement of the flatness is dramatically increased in comparison with the reference. Based on this result, it was confirmed that the thermal processing of the present embodiment can improve the flatness of the surface of the silicon substrate.

FIG. 8 illustrates the two-dimensional power spectrum of the roughness of the surface of the silicon substrate after the thermal processing. In FIG. 8, the spectrum of the case that the thermal processing of the present embodiment was used (EMBODIMENT), and the spectrum that Step S14 was not followed by Step S15 and directly followed by Step S16 (REFERENCE) are illustrated.

As illustrated in FIG. 8, when the thermal processing of the present embodiment was used, the intensity on the short cycle side is low in comparison with the reference without Step S15. This means that the surface roughness on the short cycle side decreased, and using Step S15 advanced the repair of the C-type defects.

In the thermal processing profile illustrated in FIG. 2, the atmosphere in which Steps S11-S14 was performed was a hydrogen atmosphere, but in place of hydrogen, a rare gas may be used. The noble gas can be He (helium), Ne (neon), Ar (argon), Kr (krypton), Xe (xenon) or others. Nitrogen is not preferable because there is a risk that nitrogen might nitride the surface of the silicon substrate.

As the thermal processing profile for the case that a rare gas is used as the processing atmosphere in Steps S11-S14, the profile as exemplified in FIG. 9 may be used.

In this case, the noble gas itself does not act to dissociate the Si—O bond, and when the silicon oxide film 12 is removed in Step S13, the pressure inside the thermal processing furnace is lowered to be near the vapor pressure of the silicon oxide film 12, and the removal of the silicon oxide film 12 is enhanced. The pressure at this time is not especially limited as long as the silicon oxide film 12 can be removed, and is, e.g., not more than 5 Torr, e.g., 3 Torr.

When the thermal processing of Step S13 is continued with the pressure inside the thermal processing furnace reduced, the silicon atoms of the surface are continuously removed even after the silicon oxide film 12 has been removed. Accordingly, it is preferable to increase the pressure in the thermal processing furnace around the time that the removal of the silicon oxide film 12 has been completed. The thermal processing of Step S13 is set one with the pressure inside the thermal processing furnace increased, the rearrangement of the silicon atoms of the surface can be enhanced and the elimination of the silicon atoms of the surface is prevented. The pressure inside the thermal processing furnace for the rearrangement of the silicon atoms of the surface is not especially limited as long as the pressure is in the range in which the elimination of the silicon atoms of the surface can be sufficiently suppressed, and is, e.g., 20 Torr.

The other steps are the same as those of the thermal processing profile illustrated in FIG. 2.

As described above, according to the present embodiment, the thermal processing of Step S15 is made after the thermal processing of Step S13, whereby the atomic level flatness of the surface of the silicon substrate can be improved. The dangling bonds of the silicon atoms are surely terminated with hydrogen atoms, whereby the stability of the surface of the silicon substrate can be improved.

A Second Embodiment

A method of manufacturing a semiconductor device according to a second embodiment will be described with reference to FIGS. 10 to 19. The same members of the present embodiment as those of the method of manufacturing the semiconductor device according to the first embodiment illustrated in FIGS. 1A to 9 are represented by the same reference numbers not to repeat or to simplify the description.

Figure 10:
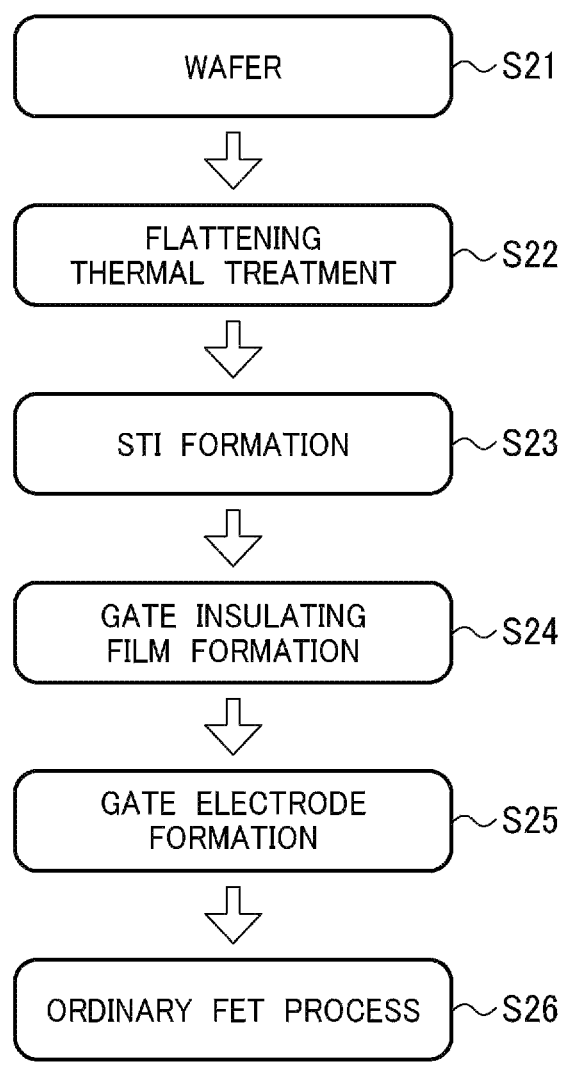
FIG. 10 is a flow chart illustrating a method of manufacturing a semiconductor device according to a second embodiment.
Figure 11:
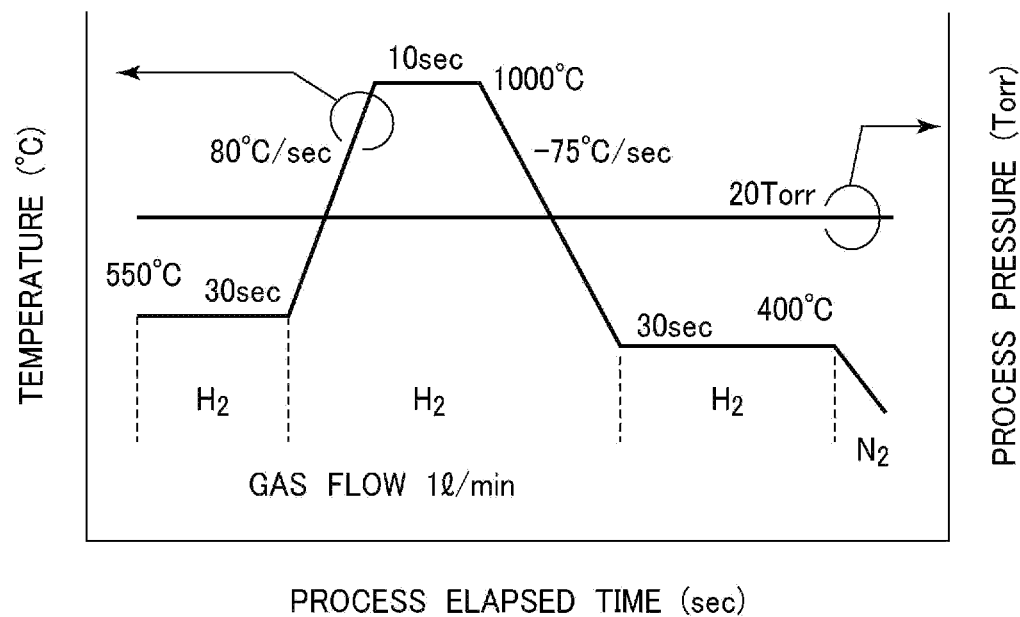
FIGS. 11 and 12 are graphs illustrating a thermal processing profile of the method of manufacturing the semiconductor device according to the second embodiment.
Figure 12:
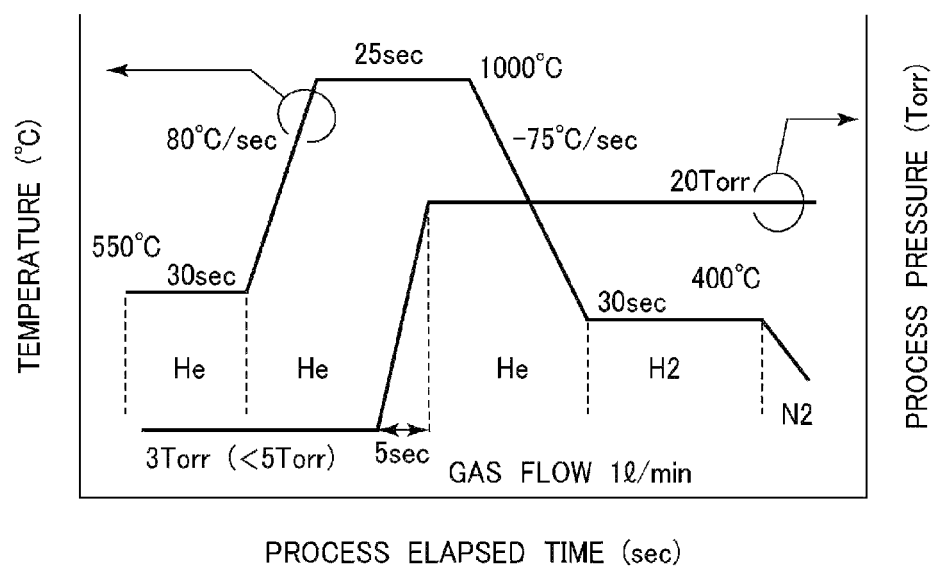

FIG. 10 is a flow chart illustrating the method of manufacturing the semiconductor device according to the present embodiment. FIGS. 11 and 12 are graphs illustrating a thermal processing profile of the method of manufacturing the semiconductor device according to the present embodiment. FIGS. 13A-18B are cross-sectional views illustrating the method of manufacturing the semiconductor device according to the second embodiment. FIG. 19 is a graph illustrating a result of low-frequency noise measurement made on the semiconductor device manufactured by the manufacturing method according to the present embodiment.

In the method of manufacturing the semiconductor device according to the present embodiment, at the initial stage of the wafer process. i.e., before the device isolation insulating film, the wells, etc. are formed, the thermal processing for the surface flattening (the flattening thermal processing) described in the first embodiment is made.

That is, as illustrated in FIG. 10, a silicon substrate to be processed is prepared (Step S21), then the planarization thermal processing (Step S22) is made, then the STI (Shallow Trench Isolation) is formed (Step S23), the gate insulating film is formed (Step S24), then the gate electrode is formed (Step S25), and then the following ordinary FET process, etc. are made (Step S26), and the semiconductor device is manufactured.

Next, the method of manufacturing the semiconductor device will be detailed with reference to FIGS. 11 to 18.

First, a silicon substrate 10 for a semiconductor device to be formed on is prepared (Step S21).

Next, wet etching with, e.g., hydrofluoric acid aqueous solution is made to remove a native oxide film (not illustrated) on a surface of the silicon substrate 10.

Next, the silicon substrate 10 is thermally processed, using the thermal processing profile illustrated in, e.g., FIG. 11, and the surface of the silicon substrate 10 is flattened (Step S22).

First, in Step S11, the thermal processing is made, e.g., at 550 C and for 30 seconds. Next, in Step S12, the temperature is ramped up from 550 C to 1000 C at, e.g. an 80 C/second ramping up rate. Next, in Step S13, the thermal processing is made, e.g., at 1000 C and for 10 seconds. Then, in Step S14, the temperature is ramped down from 1000 C to 400 C at, e.g., a −75 C/second ramping down rate. Then, in Step S15, the thermal processing is made, e.g., at 400 C and for 30 seconds. Next, in Step S16, the temperature is cooled from 400 C to room temperature, and the silicon substrate 10 is unloaded out of the thermal processing furnace. The thermal processing atmosphere is a hydrogen atmosphere from Step S11 to Step S15, and a nitrogen atmosphere is used in Step S16. Into the thermal processing furnace, the gas is fed at, e.g., a 1 liter/minutes flow rate, and the processing pressure is, e.g., 20 Torr throughout Steps S11-S16.

In place of the thermal processing profile of FIG. 11, the thermal processing profile of, e.g., FIG. 12 may be used. In this case, first, in Step S11, the thermal processing is made, e.g., at 550 C and for 30 seconds. Next, in Step S12, the temperature is ramped up from 550 C to 1000 C at, e.g., an 80 C/second ramping up rate. Then, in Step S13, the thermal processing is made, e.g., at 1000 C and for 25 seconds. Next, in Step S14, the temperature is ramped down from 1000 C to 400 C at, e.g., a −75 C/second ramping down rate. Then, in Step S15, the thermal processing is made, e.g., at 400 C and for 30 seconds. Then, in Step S16, the temperature is cooled from 400 C to room temperature, and the silicon substrate 10 is unloaded out of the thermal processing furnace. The thermal processing atmosphere is, e.g., a He atmosphere throughout Steps S11-S14, and in Step S15, a hydrogen atmosphere is used, and in Step S16, a nitrogen atmosphere is used. The pressure inside the thermal processing furnace is, e.g., 3 Torr up to the middle of Step S13, and the pressure is raised to 20 Torr in, e.g., seconds to make the remaining thermal processing of Step S13, and then, the pressure is constantly 20 Torr up to Step S16.

The surface of the silicon substrate 10 before Step S22 is performed has roughness, and the silicon oxide film 12 is formed during the process until the silicon substrate 10 is loaded in the thermal processing furnace (see FIG. 1A). By the thermal processing of Steps S22, the silicon oxide film 12 is removed, the surface of the silicon substrate is planarized at the atomic level and the dangling bonds of the silicon atoms of the surface of the silicon substrate 10 is terminated by hydrogen (see FIG. 1B).

Next, in the silicon substrate 10 after the planarization thermal processing, a device isolation insulating film 20 is formed by, e.g., STI method (Step S23).

First, a silicon oxide film 14 of, e.g., a 10 nm-thickness is formed above the silicon substrate 10 by, e.g., thermal oxidation method.

Figure 13A:
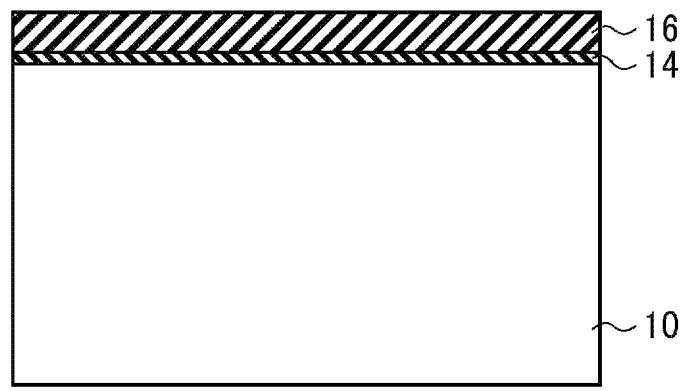
FIGS. 13A-13B, 14A-14B, 15A-15B, 16A-16B, 17A-17B and 18A-18B are cross-sectional views illustrating the method of manufacturing the semiconductor device according to the second embodiment.

Next, a silicon nitride film 16 of, e.g., a 112 nm-thickness is formed above the silicon oxide film 14 by, e.g., CVD (chemical vapor deposition) method (FIG. 13A).

Figure 13B:
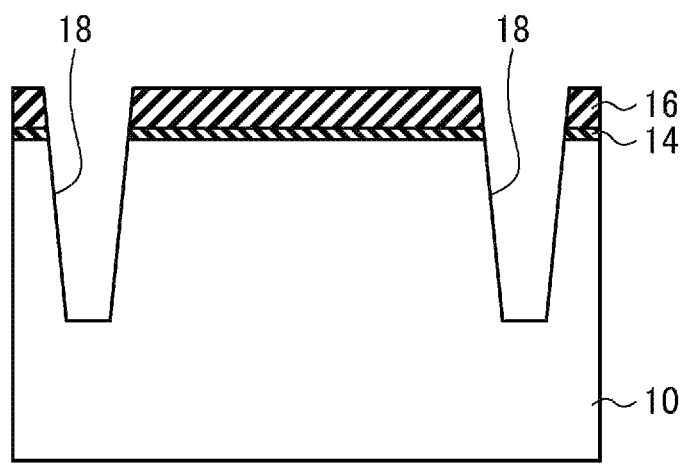

Next, by photolithography and dry etching, the silicon nitride film 16, the silicon oxide film 14 and the silicon substrate 10 are anisotropically etched to form a device isolation trench 18 of, e.g., a 300 nm-depth (FIG. 13B).

Then, a silicon oxide film of, e.g., a 3 nm-thickness as a liner film is formed on the inside wall of the device isolation trench 18 by, e.g., thermal oxidation method.

Next, by, e.g., high density plasma CVD method, a silicon oxide film of, e.g., a 600 nm-thickness is deposited and filling the device isolation trench 18 with the liner film formed in by the silicon oxide film.

Figure 14A:
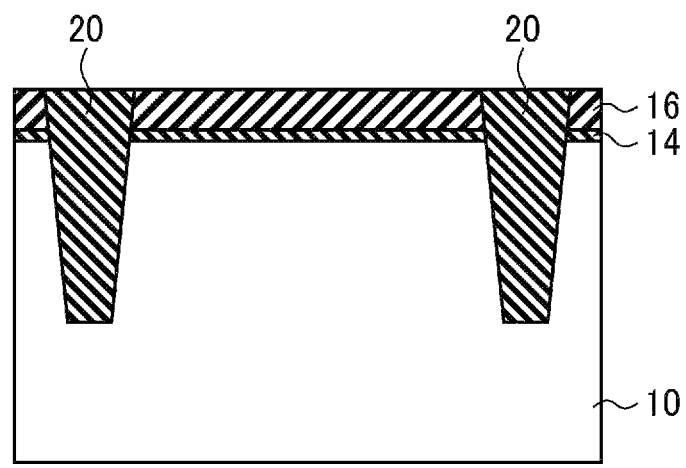

Next, the silicon oxide film above the silicon nitride film 16 is removed by, e.g., CMP (Chemical Mechanical Polishing) method. Thus the device isolation insulating film 20 formed of the silicon oxide film buried in the device isolation trench 18 is formed by the so-called STI method (FIG. 14A).

Next, a thermal processing of, e.g., 900 C is made in, e.g., a nitrogen atmosphere to densify the device isolation insulating film 20.

Then, the silicon nitride film 16 is removed by, e.g., wet etching using, e.g., hot phosphoric acid.

Next, the silicon oxide film 14 is removed by, e.g., wet etching using, e.g., hydrofluoric acid aqueous solution.

Figure 14B:
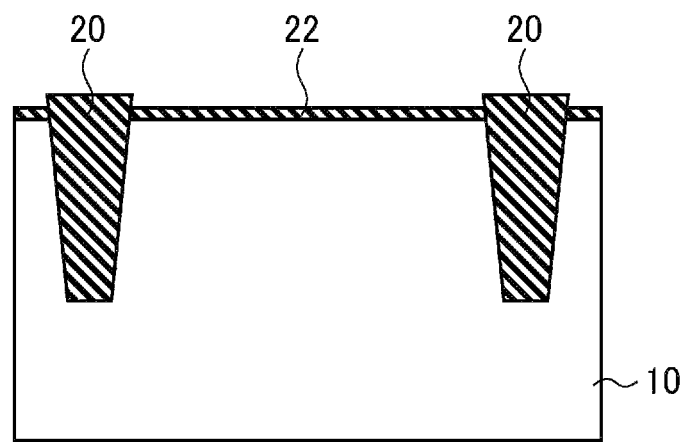

Next, a silicon oxide film 22 of, e.g., a 10 nm-thickness is formed above the active region of the silicon substrate 10 defined by the device isolation insulating film 20 by, e.g., thermal oxidation method (FIG. 14B).

Figure 15A:
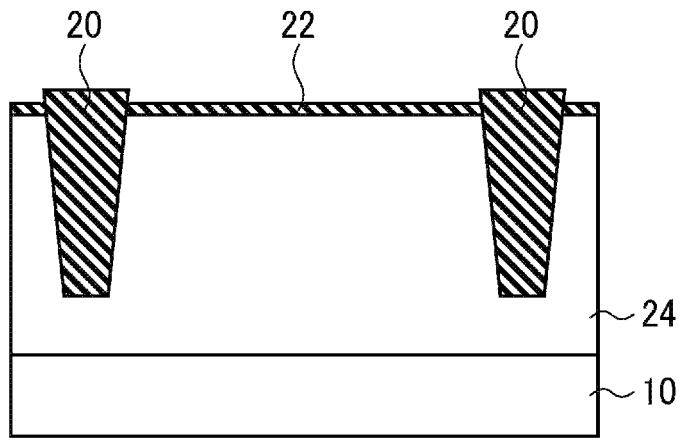

Next, well ion implantation, channel ion implantation, etc. are made in each transistor forming region of the silicon substrate 10 by photolithography and ion implantation to form a prescribed well 24 (FIG. 15A).

Figure 15B:
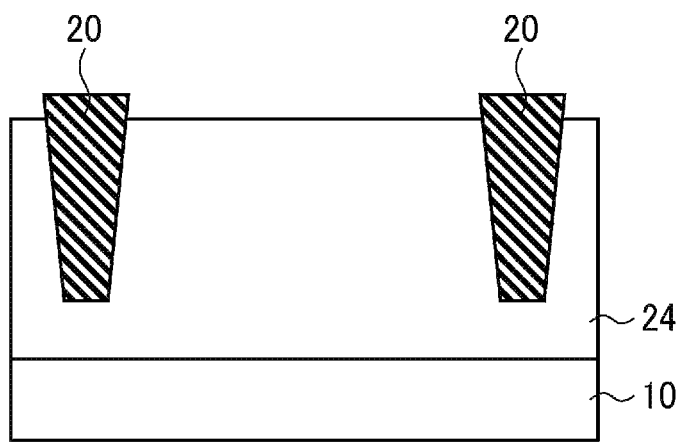

Next, the silicon oxide film 22 is removed by wet etching using, e.g., hydrofluoric acid aqueous solution (FIG. 15B).

Figure 16A:
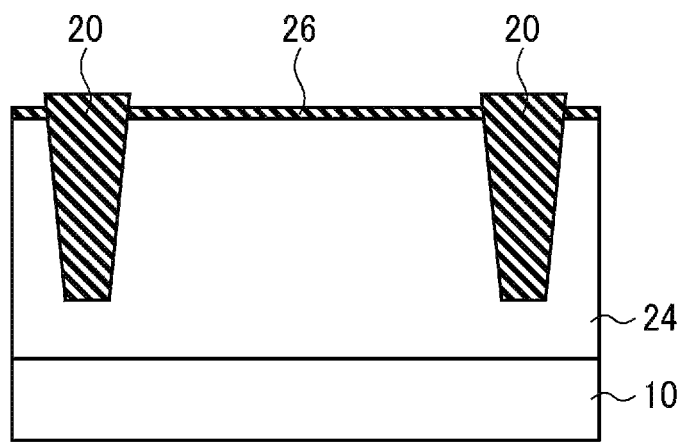

Then, a silicon oxide film of, e.g., an 8 nm-thickness is formed above the active region of the silicon substrate 10 defined by the device isolation insulating film 20 by, e.g., thermal oxidation to form a gate insulating film 26 of the silicon oxide film (FIG. 16A, Step S24).

Figure 16B:
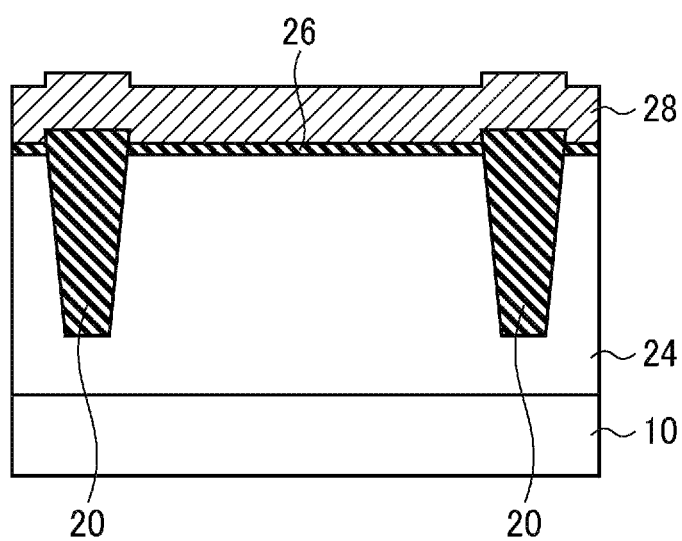

Next, a polycrystalline silicon film 28 of, e.g., a 100 nm-thickness is formed above the entire surface by, e.g., LPCVD method (FIG. 16B).

Next, the polycrystalline silicon film 28 is patterned by photolithography and dry etching to form a gate electrode 30 in the transistor forming region (Step S25).

Figure 17A:
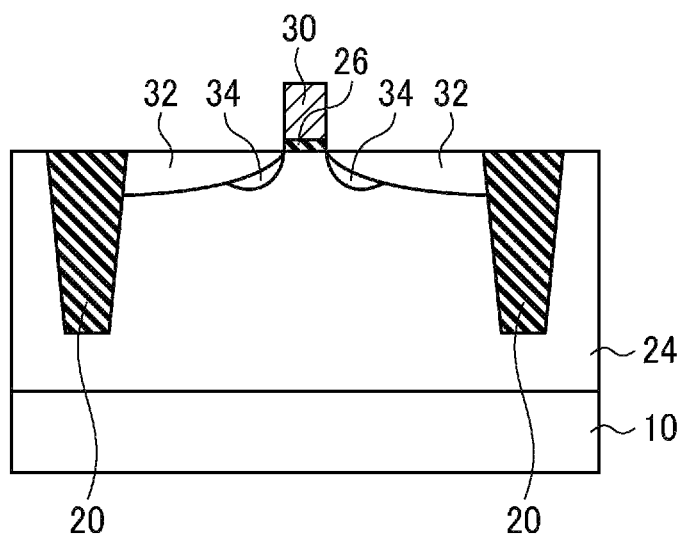

Next, by photolithography and ion implantation, impurity ions of a prescribed conductivity type are implanted into the transistor forming region with the gate electrode 30 as the mask to form the necessary impurity layers, such as an impurity layer 32 to be the extension regions, an impurity layer 34 to be the pocket regions, etc. (FIG. 17A).

Next, a silicon oxide film, for example, is deposited above the entire surface by, e.g., CVD method, and then the silicon oxide film is anisotropically etched to form a sidewall spacer 36 on the side walls of the gate electrode 30.

Figure 17B:
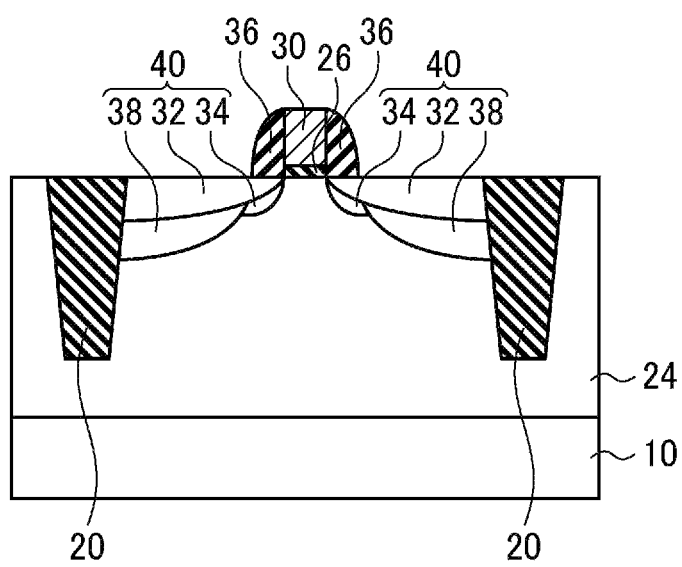

Next, by photolithography and ion implantation, impurity ions of a prescribed conductivity type are implanted into the transistor forming region with the gate electrode 36 and the sidewall spacer 36 as the mask to form an impurity layer 38. Thus, the source/drain regions 40 with the pockets formed of the impurity layers 32, 34, 38, for example, are formed. Thus, on the silicon substrate 10, a MOS transistor including the gate electrode 30, and the source/drain regions 40 is formed (FIG. 17B, Step S26).

Figure 18A:
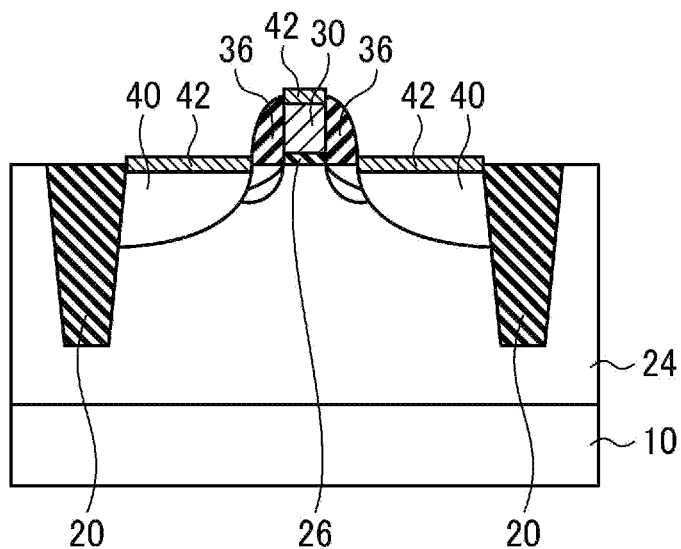
Figure 19:
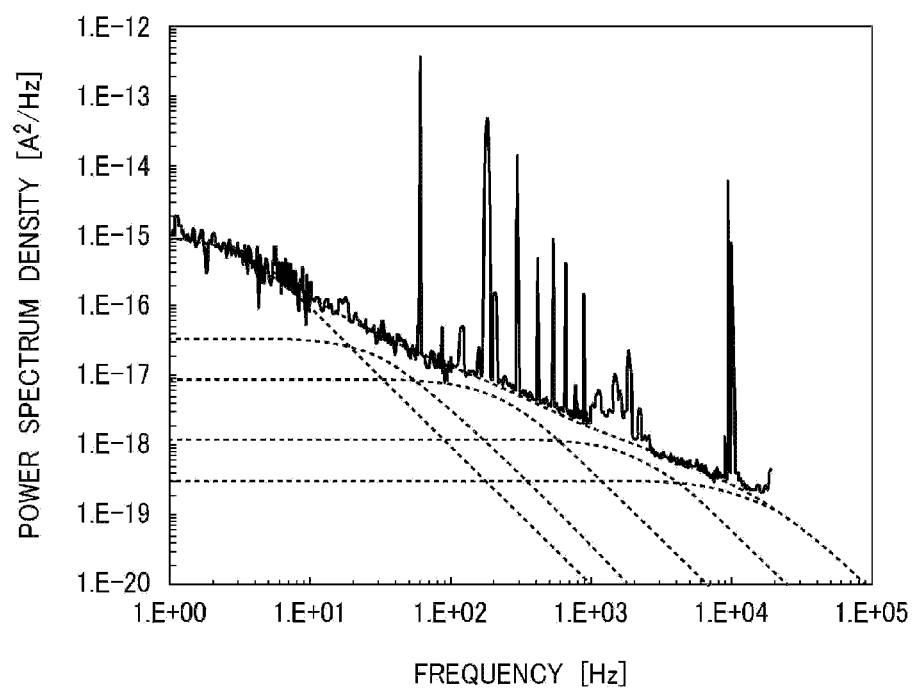
FIG. 19 is a graph illustrating a result of low-frequency noise measurement made on the semiconductor device manufactured by the manufacturing method according to the second embodiment.

Next, by salicide (self-aligned silicide) process, a metal silicide film 42 of, e.g., a cobalt silicide film is formed on the gate electrode 30 and the source/drain regions 40 (FIG. 18A).

Next, a silicon nitride film and a silicon oxide film, for example, are deposited above the entire surface by, e.g., CVD method to form an inter-layer insulating film 44 of the silicon oxide film/silicon nitride film structure.

Figure 18B:
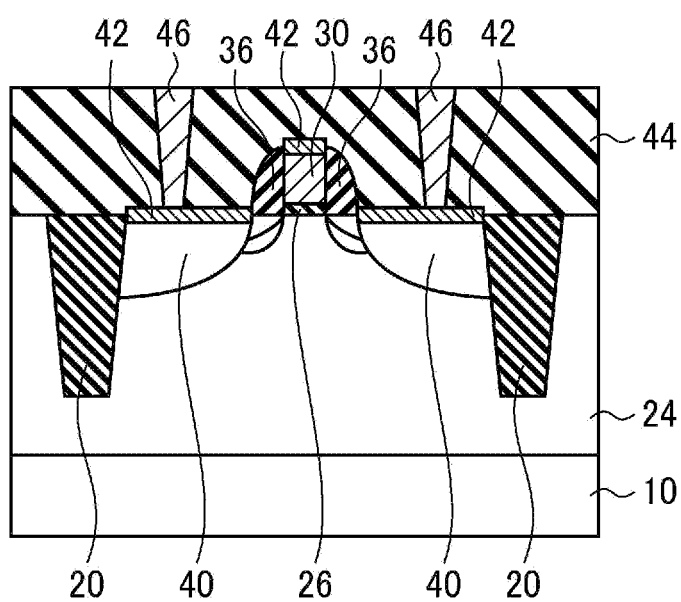

Next, contact plugs 46 connected to the metal silicide film 42 are formed in the inter-layer insulating film 44 (FIG. 18B).

Then, a prescribed backend process is made, and the semiconductor device is completed.

FIG. 19 is a graph illustrating the result of the low frequency noise measurement measured on the MOS transistor manufactured by the semiconductor device manufacturing method according to the second embodiment described above.

RTN (Random Telegraph Noise) is a noise component of the drain current generated by the carriers being captured by defects in the gate insulating film, defects near the interface between the gate insulating film and the silicon substrate, or the carriers being released from the defects. The RTN is characterized in that the power spectrum density exhibits Lorentz type having a $1/f^2$ inclination. FIG. 19 illustrates that the low frequency noise can be represented by overlapping the RTN.

As illustrated in FIG. 19, in the semiconductor device according to the present embodiment, the power spectrum density has an about $1/f^2$ inclination and no conspicuous increase of the RTN component is found even in the low frequency region.

Figure 22:
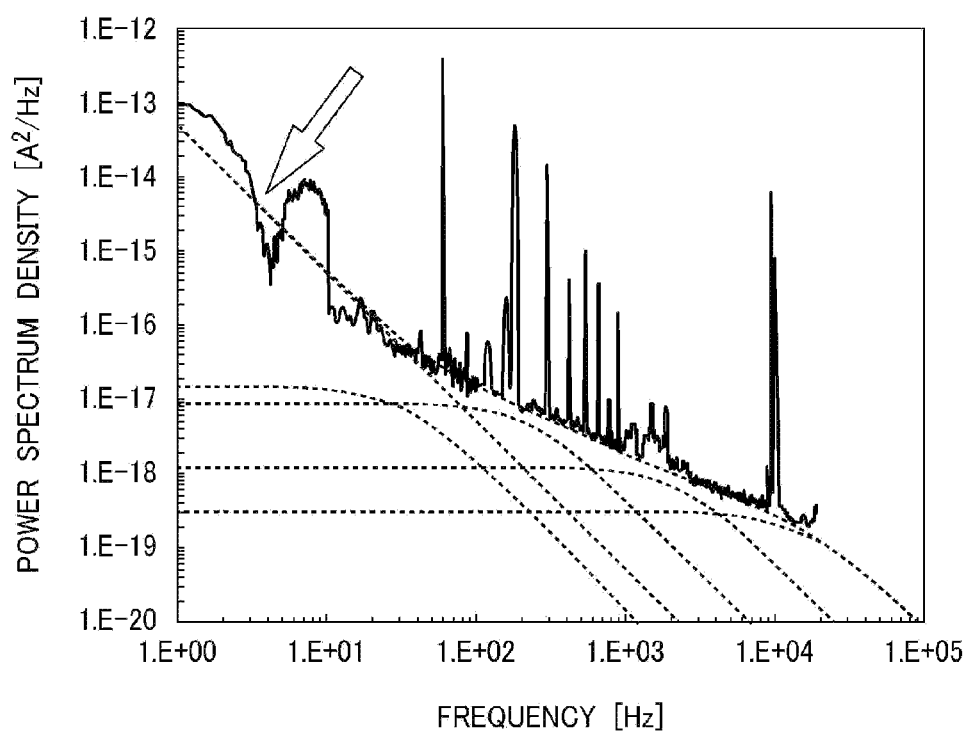
FIG. 22 is a graph illustrating a result of low-frequency noise measurement made on the semiconductor device manufactured by the manufacturing method according to the reference embodiment.

In contrast to this, as described in the reference embodiment to be described below, in a MOS transistor manufactured after the thermal processing has been made with the thermal processing profile of the case that Step S14 is directly followed by Step S16 without Step S15, as shown in FIG. 22, the noise component (low frequency noise) having a 1/f2 inclination is found in the low frequency region (indicated by the arrow in FIG. 22).

Based on the above, making the thermal processing of Step S21 of the method of manufacturing the semiconductor device according to the present embodiment can decrease the defects in the gate insulating film 26 and in the interface between the gate electrode and the gate insulating film 26, and can drastically decrease the low frequency noise.

As described above, according to the present embodiment, the thermal processing of Step S15 is made after the thermal processing of Step S13, whereby the planarity of the surface of the silicon substrate at the atomic level can be improved. The dangling bonds of the silicon atoms can be surely terminated with hydrogen atoms, and the stability of the surface of the silicon substrate can be improved. Thus, the low frequency noise of the MOS transistor can be reduced, and the reliability of the semiconductor device can be improved.

A Third Embodiment

A method of manufacturing a semiconductor device according to a third embodiment will be described with reference to FIG. 20. The same members of the present embodiment as those of the method of manufacturing the semiconductor device according to the first and the second embodiments illustrated in FIGS. 1A to 19 are represented by the same reference numbers not to repeat or to simplify the description.

Figure 20:
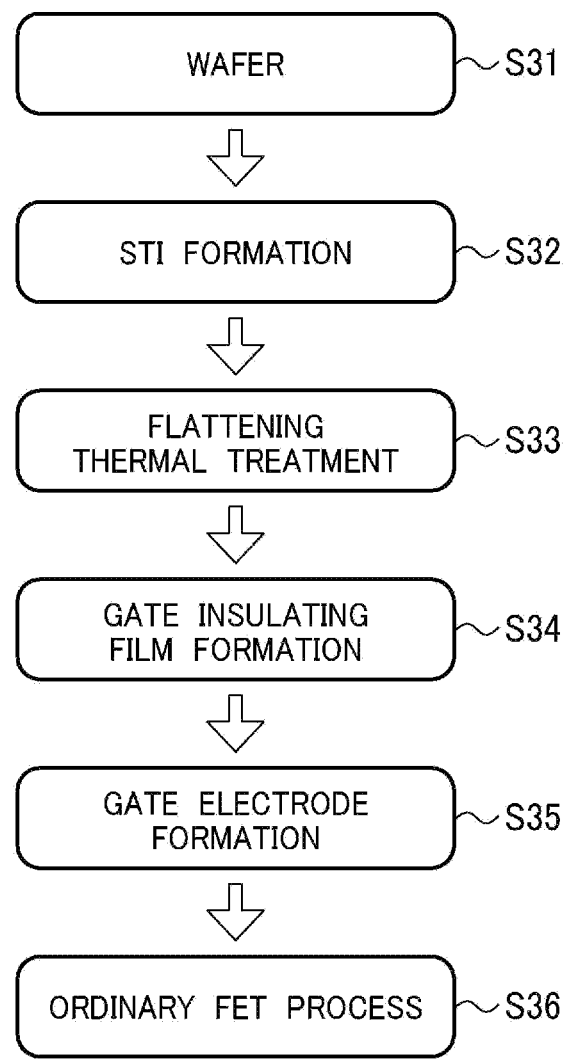
FIG. 20 is a flow chart illustrating a method of manufacturing a semiconductor device according to a third embodiment.

FIG. 20 is a flow chart illustrating the method of manufacturing the semiconductor device according to the present embodiment.

In the method of manufacturing the semiconductor device according to the present embodiment, the thermal processing for flattening the surface (flattening thermal processing) described in the first embodiment is made immediately before forming the gate insulating film.

That is, as illustrated in FIG. 20, a silicon substrate to be processed is prepared (Step S31), then the STI is formed (Step S32), then the flattening thermal processing (Step S33) is made, then the gate insulating film is formed (Step S34), then the gate electrode is formed (Step S35), and then the following ordinary FET process, etc. are made (Step S36), and the semiconductor device is manufactured.

Specifically, first, in the same way as in, e.g., the method of manufacturing the semiconductor device according to the second embodiment illustrated in FIGS. 13A-15B, the device isolation insulating film 20, the well 24, etc. are formed, and then the silicon oxide film as the protection film for the ion implantation is removed (Steps S31-S32).

Next, by the use of the thermal processing profile of, e.g., FIG. 11 or FIG. 12, the flattening thermal processing is made (Step S33).

Next, in the same way as in, e.g., the method of manufacturing the semiconductor device according to the second embodiment illustrated in FIGS. 16A to 18B, the semiconductor device is completed.

It has been confirmed that in the MOS transistor manufactured by the method of manufacturing the semiconductor device according to the present embodiment as well as in the method of manufacturing the semiconductor device according to the second embodiment, the low frequency noise can be drastically decreased.

As described above, according to the present embodiment, the thermal processing of Step S15 is made after the thermal processing of Step S13, whereby the planarity of the surface of the silicon substrate at the atomic level can be improved. The dangling bonds of the silicon atoms can be surely terminated with hydrogen atoms, and the stability of the surface of the silicon substrate can be improved. Thus, the low frequency noise of the MOS transistor can be reduced, and the reliability of the semiconductor device can be improved.

Reference Embodiment

A method of manufacturing a semiconductor device according to a reference embodiment will be described with references FIGS. 21 and 22. The same members of the present embodiment as those of the method of manufacturing the semiconductor device according to the first to the third embodiments illustrated in FIGS. 1A to 20 are represented by the same reference numbers not to repeat or to simplify the description.

Figure 21:
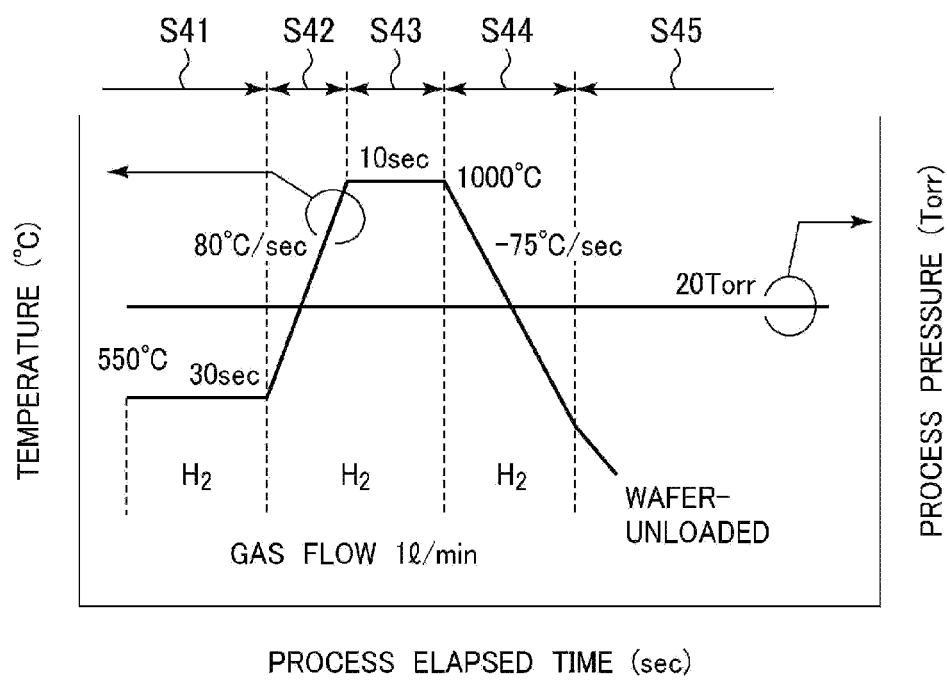
FIG. 21 is a graph illustrating a thermal processing profile of a method of manufacturing a semiconductor device according to a reference embodiment.

FIG. 21 is a graph illustrating a thermal processing profile of the method of manufacturing the semiconductor device according to the present embodiment. FIG. 22 is a graph illustrating a result of low-frequency noise measurement made on the semiconductor device manufactured by the manufacturing method according to the present embodiment.

The method of manufacturing the semiconductor device according to the present reference is the same as the method of manufacturing the semiconductor device according to the second embodiment except that the thermal processing profile of Step S22 is different.

In the present embodiment, Step S22 is made with the thermal processing profile of FIG. 21.

First, in Step S41, the thermal processing of, e.g., 550 C and 30 seconds is made. Next, in Step S42, the temperature is ramped up from 550 C to 1000 C at, e.g., an 80 C/second ramping up rate. Next, in Step S43, the thermal processing of, e.g., 1000 C and 10 seconds is made. In Step S44, the temperature is ramped down from 1000 C to 400 C at, e.g., a −75 C/second ramping down rate. Then, in Step S45, the temperature is cooled down from 400 C to room temperature, and the silicon substrate 10 is unloaded out of the thermal processing furnace. The thermal processing atmosphere is a hydrogen atmosphere form Step S41 to Step S44 and is a nitrogen atmosphere in Step S45. The gas is fed into the thermal processing furnace at, e.g., a 1 liter/minute flow rate, and the processing pressure is, e.g., 20 Torr from Step S41 to Step S45.

A difference of the thermal processing profile of FIG. 21 from the thermal processing profile of FIG. 11 is that Step S44 is followed directly by Step S45 corresponding to Step S16 without a step corresponding to Step S15 is performed.

FIG. 22 is a graph illustrating the result of the low frequency noise measurement measured on the MOS transistor manufactured by the use of the thermal processing profile in Step S22.

As illustrated in FIG. 22, in the MOS transistor manufactured by the manufacturing method according to the present embodiment, the noise component having a $1/f^2$ inclination in the low frequency region (low frequency noise) was detected (indicated by the arrow in FIG. 22).

Modified Embodiments

The above-described embodiments can cover other various modifications.

For example, the above-described embodiments have been described by means of the case that a (100) silicon substrate is used. The (100) silicon substrate is not essential, and substrates of other orientations, e.g., a (111) silicon substrate may be used. Otherwise, offset substrates inclined by prescribed angles in prescribed direction to a prescribed orientation may be used.

In the second and the third embodiments described above, the method of manufacturing the semiconductor device has been described by means of 1 transistor but is applicable to semiconductor devices including transistors of plural kinds. For example, in a method of manufacturing a semiconductor device including transistors of plural kinds having gate insulating films different in the film thickness, the above-described thermal processing can be made before a sting of the steps of forming the gate insulating films is made, whereby the same effect can be produced. This is the same with semiconductor devices including memory transistors of the stacked gate structure.

The structure, the constituent materials, the manufacturing conditions, etc. of the semiconductor device described in the above embodiments can be suitably modified or changed corresponding to the technical common sense, etc. of those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A method of manufacturing a semiconductor device comprising:
    performing a first thermal processing a silicon substrate in a first atmosphere and at a first temperature to remove an oxide film above a surface of the silicon substrate; and
    after the first thermal processing, performing a second thermal processing the silicon substrate in a second atmosphere including hydrogen and at a second temperature lower than the first temperature to terminate the surface of the silicon substrate with hydrogen, wherein:
    the first thermal processing comprises a first step and a second step after the first step, the first step is performed at a first pressure, in the first atmosphere and at the first temperature, the second step is performed at a second pressure, in the first atmosphere and at the first temperature, the second pressure is higher than the first pressure,
    a sublimation of the oxide film from the surface is enhanced at the first temperature and the first pressure,
    the first pressure is about vapor pressure of the oxide film at the first temperature, and
    a sublimation of silicon atoms from the surface is suppressed at the first temperature and the second pressure.

2. The method of manufacturing a semiconductor device according to claim 1, wherein
    in the second thermal processing, C-type defects on the surface of the silicon substrate are repaired.

3. The method of manufacturing a semiconductor device according to claim 1, wherein
    the second temperature is a temperature that makes a two-dimensional migration of silicon atoms of the surface of the silicon substrate more dominant than a three-dimensional migration thereof.

4. The method of manufacturing a semiconductor device according to claim 1, wherein
    the second temperature is lower than a temperature corresponding to an energy which dissociates Si—H bond.

5. The method of manufacturing a semiconductor device according to claim 1, wherein
    the second temperature is 350° C.-500° C.

6. The method of manufacturing a semiconductor device according to claim 1, wherein
    the second thermal processing is made for 30 seconds or more.

7. The method of manufacturing a semiconductor device according to claim 1, wherein
    in the first thermal processing, after the oxide film has been removed, silicon atoms of the surface of the silicon substrate are rearranged to form a step-and-terrace structure, the surface of the silicon substrate is flatten.

8. The method of manufacturing a semiconductor device according to claim 1, wherein
    the first temperature is 950° C. to 1200° C.

9. The method of manufacturing a semiconductor device according to claim 1, wherein
    the first atmosphere includes hydrogen.

10. The method of manufacturing a semiconductor device according to claim 1, wherein
    the first atmosphere includes only a noble gas.

11. The method of manufacturing a semiconductor device according to claim 1, further comprising, after the second thermal processing:
    thermally oxidizing the silicon substrate to form a silicon oxide film on the silicon substrate.

12. The method of manufacturing a semiconductor device according to claim 11, wherein
    the silicon oxide film is a gate insulating film.

13. The method of manufacturing a semiconductor device according to claim 1, further comprising, after the second thermal processing:
    forming a device isolation insulating film in the silicon substrate.

14. The method of manufacturing a semiconductor device according to claim 1, further comprising, after the second thermal processing:
    cooling down the temperature of the silicon substrate from the second temperature to room temperature in a third atmosphere containing nitrogen.

15. The method of manufacturing a semiconductor device according to claim 1, wherein
    the first thermal processing and the second thermal processing are made with a lamp annealing system with reduced pressure.

16. The method of manufacturing a semiconductor device according to claim 1, further comprising
    forming a gate insulating film on the silicon substrate after the second thermal processing; and
    forming a gate electrode on the gate insulating film.

* * * * *